(12) United States Patent
Nickolls (10) Patent No.: US 6,879,207 B1
(45) Date of Patent: Apr. 12, 2005

(54) DEFECT TOLERANT REDUNDANCY

(75) Inventor: John R. Nickolls, Los Altos, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 10/741,243

(22) Filed: Dec. 18, 2003

(51) Int. Cl.[7] .............................................. G06F 1/04
(52) U.S. Cl. ...................................... 327/526; 326/10
(58) Field of Search ................................. 327/292–293, 327/295–296, 403–404, 407–408, 525–526; 326/10

(56) References Cited

U.S. PATENT DOCUMENTS

| | | | | |
|---|---|---|---|---|
| 5,276,360 A | * | 1/1994 | Fujima | 326/10 |
| 5,369,314 A | * | 11/1994 | Patel et al. | 326/13 |
| 6,091,258 A | * | 7/2000 | McClintock et al. | 326/10 |
| 6,107,820 A | * | 8/2000 | Jefferson et al. | 326/38 |

* cited by examiner

*Primary Examiner*—My-Trang Nu Ton
(74) *Attorney, Agent, or Firm*—Townsend and Townsend and Crew LLP; J. Matthew Zignant (57) ABSTRACT

Circuits, methods, and apparatus for using redundant circuitry on integrated circuits in order to increase manufacturing yields. One exemplary embodiment of the present invention provides a circuit configuration wherein functional circuit blocks in a group of circuit blocks are selected by multiplexers. Multiplexers at the input and output of the group of circuit blocks steer input and output signals to and from functional circuit blocks, avoiding circuit blocks found to be defective or nonfunctional. Multiple groups of these circuit blocks may be arranged in series and in parallel. Alternate multiplexer configurations may be used in order to provide a higher level of redundancy. Other embodiments use all functional circuit blocks and sort integrated circuits based on the level of functionality or performance. Other embodiments provide methods of testing integrated circuits having one or more of these circuit configurations.

21 Claims, 9 Drawing Sheets

DEFECT TOLERANT REDUNDANCY

BACKGROUND

The present invention relates to using redundant circuitry on integrated circuits in order to increase manufacturing yields.

Integrated circuits are manufactured on wafers, which are typically made of silicon that undergoes several processing steps. Once wafer processing is complete, the integrated circuits on the wafer are tested. This testing procedure is known as wafer sort. After wafer sort, the integrated circuits, the die, are separated from one another, and the good die, those that pass wafer sort testing, are packaged. The packaged parts are retested in a procedure referred to as final test. The packaged parts that pass final test may then be used or sold.

It is desirable to have as many good die per wafer as possible. This helps amortize the expense of a wafer among a greater number of die, thus reducing per die costs. Unfortunately, in a conventional integrated circuit, one defective or nonfunctional circuit block out of many is enough to render an entire die inoperable.

This is particularly troublesome for large integrated circuits. Errors in processing, such as opens, shorts, crystal defects, metal bridging, and other problems, tend to be exponentially proportional to die area. Thus, larger integrated circuits are more likely to have a defect than a smaller circuit. Also, since there are fewer die per wafer to start with, this higher rate of attrition has a particularly negative effect.

Accordingly, it is desirable to include some number of redundant circuit blocks on an integrated circuit. If one circuit block is defective, the integrated circuit functionality can be retained if the redundant circuit block can be substituted for the defective block. But saving the functionality of an integrated circuit does not make economic sense if the overhead or cost in terms of die area of the redundant and associated circuitry is such that the number of die per wafer is decreased significantly.

Thus, what is needed are circuits, methods, and apparatus for using redundant circuitry on integrated circuits to increase manufacturing yields, preferably without greatly increasing die area and circuit complexity.

SUMMARY

Accordingly, embodiments of the present invention provide circuits, methods, and apparatus for using redundant circuitry on integrated circuits in order to increase manufacturing yields. One exemplary embodiment of the present invention provides a circuit configuration where functional circuit blocks in a group of circuit blocks are selected by multiplexers or other appropriate selection circuitry or apparatus. In particular, multiplexers at the input and output of the group steer input and output signals to and from functional circuit blocks, avoiding circuit blocks found to be defective or nonfunctional. Multiple groups of these circuit blocks may be arranged in series and in parallel. Alternate multiplexer configurations may be used in order to provide a higher level of redundancy. Other embodiments use the available functional circuit blocks (or whichever circuit blocks are functional, so long as a certain threshold number are functional) and segregate integrated circuits into bins based on their level of functionality, that is, based on how many circuit blocks are functional. Other embodiments of the present invention provide methods of testing integrated circuits having one or more of these circuit configurations. Various embodiments of the present invention may incorporate one or more of these and the other configurations and testing procedures described herein.

An exemplary embodiment of the present invention provides an integrated circuit. This integrated circuit includes a first circuit block, a second circuit block, a first selection circuit coupled to receive an input signal and provide an output to the first circuit block, a second selection circuit coupled to receive the input signal and provide an output to the second circuit block, and a third selection circuit coupled to receive an output from the first circuit block and an output from the second circuit block. The third selection circuit is further configured to provide a first output signal. If the first circuit block is defective, the first selection circuit does not couple the input signal to the first circuit block and the second selection circuit couples the input signal to the second circuit block. If the first circuit block is not defective, the first selection circuit couples the input signal to the first circuit block and the second selection circuit does not couple the input signal to the second circuit block.

Another exemplary embodiment of the present invention provides an integrated circuit. This integrated circuit includes a first circuit block, a second circuit block, a first selection circuit coupled to receive a first input signal and provide an output to the first circuit block, a second selection circuit coupled to receive the first input signal and a second input signal and provide an output to the second circuit block, a third selection circuit coupled to receive an output from the first circuit block and an output from the second circuit block, and a fourth selection circuit coupled to receive the output from the second circuit block. The third selection circuit is further coupled to provide a first output signal and the fourth selection circuit is further configured to provide a second output signal. If the first circuit block is defective, the first selection circuit does not couple the first input signal to the first circuit block and the second selection circuit couples the first input signal to the second circuit block. If the first circuit block is not defective, the first selection circuit couples the first input signal to the first circuit block and the second selection circuit couples the second input signal to the second circuit block.

Yet another exemplary embodiment of the present invention provides a method of testing an integrated circuit. This method includes testing a plurality of circuit blocks in a portion of the integrated circuit, and determining a number of defective circuit blocks in the plurality of circuit blocks. If the number of defective circuit blocks is equal to or less than a number of redundant blocks in the plurality of circuit blocks, then programming the integrated circuit with a number of programmable bits. The programmable bits determine a selection made by a first selection circuit coupled to the input of one of the plurality of circuit blocks, as well as a selection made by a second selection circuit coupled to the output of the one of the plurality of circuit blocks.

A better understanding of the nature and advantages of the present invention may be gained with reference to the following detailed description and the accompanying drawings.

DESCRIPTION OF EXEMPLARY EMBODIMENTS

Figure 1:
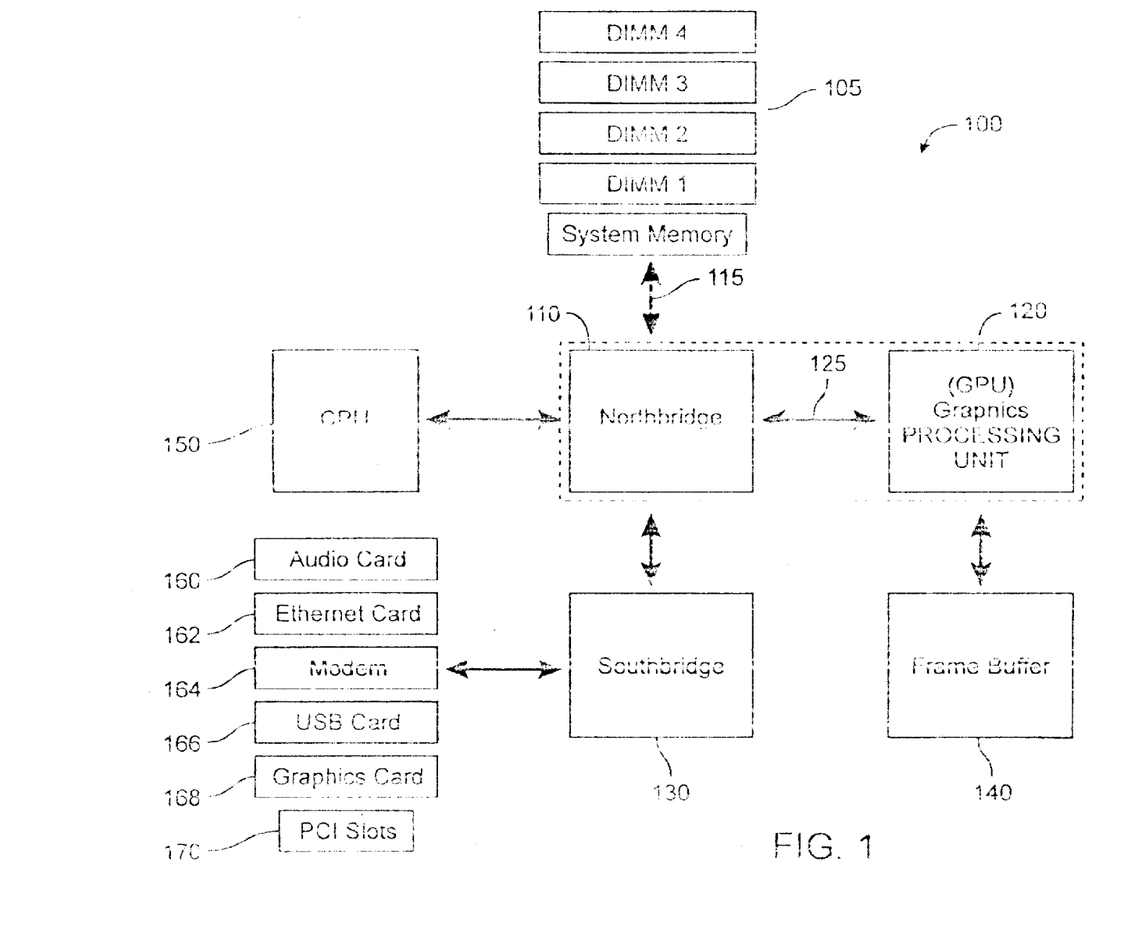
FIG. 1 is a block diagram of a computing system that benefits by incorporation of embodiments of the present invention.

FIG. 1 is a block diagram of a computing system 100 that benefits by incorporation of embodiments of the present invention. Included are a Northbridge 110, graphics processing unit (GPU) 120, Southbridge 130, frame buffer 140, central processing unit (CPU) 150, audio card 160, Ethernet card 162, modem 164, USB card 166, graphics card 168, PCI slots 170, and memories 105. This figure, as with all the included figures, is shown for illustrative purposes only, and does not limit either the possible embodiments of the present invention or the claims.

The Northbridge 110 passes information from the CPU 150 to and from the memories 105, graphics processing unit 120, and Southbridge 130. Southbridge 130 interfaces to external communication systems through connections such as the universal serial bus (USB) card 166 and Ethernet card 162. The graphics processing unit 120 receives graphics information over the accelerated graphics port (AGP) bus 125 through the Northbridge 110 from CPU 150 and directly from memory or frame buffer 140. The graphics processing unit 120 interfaces with the frame buffer 140. Frame buffer 140 may include a display buffer which stores the pixels to be displayed.

In this architecture, CPU 150 performs the bulk of the processing tasks required by this computing system. In particular, the graphics processing unit 120 relies on the CPU 150 to set up calculations and compute geometry values. Also, the audio or sound card 160 relies on the CPU 150 to process audio data, positional computations, and various effects, such as chorus, reverb, obstruction, occlusion, and the like, all simultaneously. Moreover, the CPU 150 remains responsible for other instructions related to applications that may be running, as well as for the control of the various peripheral devices connected to the Southbridge 130.

Figure 2:
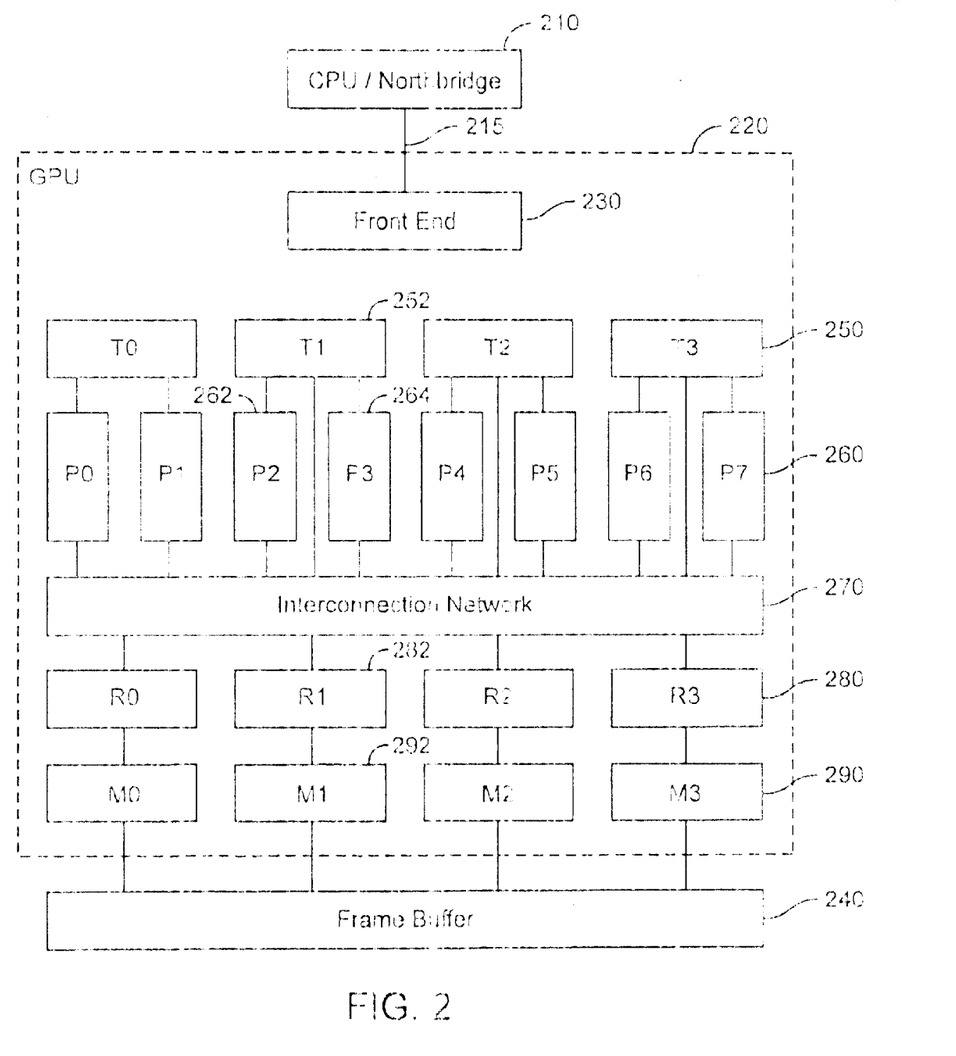
FIG. 2 is a block diagram of a graphics processing unit that benefits by incorporation of embodiments of the present invention.

FIG. 2 is a block diagram of a graphics processing unit that benefits by incorporation of embodiments of the present invention. This graphics processing unit 220 is connected to a CPU/Northbridge 210 and a frame buffer 240. The GPU 220 includes a front-end or host 230 and several texture units, each coupled to a pair of geometry/shading processors 260. The geometry/shading processors 260 are coupled through an interconnection network 270 to several raster operation (ROP) units which are in turn connected to memory interface circuits 290. The memory interface circuits 290 write and read data to and from the frame buffer 240.

The GPU 220 receives geometries, commands, and other data from the CPU through the Northbridge 210 over AGP bus 215. The front-end or host 230 receives these geometries, commands, and data, and provides them to the texture units 250, geometry/shading processors 260, and ROP units 280. The texture units 250 compute filtered values from texture images fetched from the frame buffer 240 or the CPU/Northbridge 210. The output of the texture units 250 are received by the geometry/shading processors 260. In this specific example, each texture unit 250 is connected to two geometry/shading processors 260, and is also coupled to the frame buffer 240 via an interconnection network 290 and memory interfaces 290. The geometry/shading processors 260 request texture computations from the texture units 250, and compute geometry and pixel values. The geometry/shading processors are connected through interconnection network 270 to the raster operation units (ROP) 280. The raster operation units output pixel values for display on a monitor. The raster operation units are coupled to the frame buffer 240 via memory interface units 290. The memory interface units communicate with the frame buffer 240, which stores data, textures, pixels, and other data for use by the graphics processor unit 220 and for display on a monitor.

After the GPU 220 is manufactured, it may be determined that one or more of these included circuits are defective. In that case, it is highly desirable to be able to sell or use the rest of the circuitry. Accordingly, embodiments of the present invention provide methods, circuits, and apparatus that allow one or more of these circuit blocks to be avoided, while providing a functional device. Various embodiments further provide for sorting or separating devices based their level of functionality or performance, which in turn depends on their number of defects. For example, if no circuit is defective on a GPU 220, that device may be separated as a high-functioning or high-performance device, while if one or more circuits are defective, the device may be sorted or separated as a lower-functioning or lower-performance device.

When a circuit block is nonfunctional, either that particular circuit block, or its associated pathway may be avoided. For example, if the raster operations circuit 282 is nonfunctional, that circuit may be avoided, while the other raster operations and memory interface circuits, including memory interface circuit 292, are used. Alternately, the nonfunctional raster operation circuit 282 may be avoided, while its associated memory interface circuit 292 is also avoided. Similarly, if texture unit 252 is nonfunctional, the geometry/shading processors 260 and 264 may be avoided. Alternately, the geometry/shading processors 262 and 264 may be used.

As the above example illustrates, many of the circuits in high performance integrated circuits, such as the graphics processing unit 120 in FIGS. 1 and 220 in FIG. 2, and other graphics processing units include replicated circuit blocks that function in parallel. This is typically done to increase the performance, throughput, or data handling capability of a circuit. For example, the graphics processing unit 220 in FIG. 2 is structured as parallel arrays of texture units, geometry/shading processors, raster operations circuits, and memory interface units.

On any one integrated circuit, one or more of these parallel circuit blocks may be nonfunctional. For example, there may be defects in one or more of the circuit blocks. These defects may be caused by processing errors, such as openings in contacts or vias, metal bridging, or other defects. Accordingly, embodiments of the present invention provide a benefit in that the remaining functional circuit blocks may be used, while nonfunctional circuit blocks are avoided. In this way, even though an integrated circuit may have defects which would otherwise render it inoperable, embodiments of the present invention allow the defects to be circumscribed or avoided, thus providing for an operational circuit.

Figure 3:
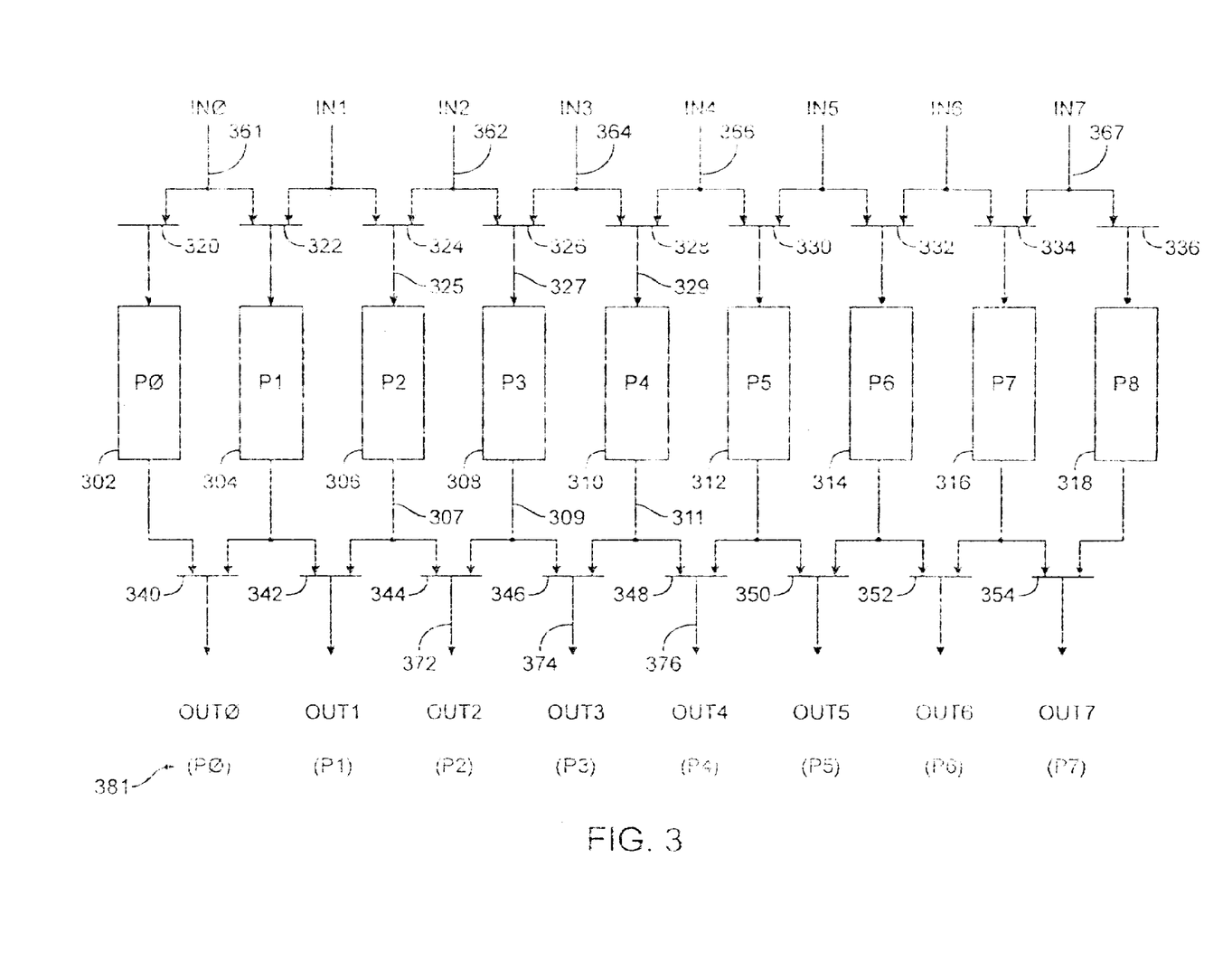
FIG. 3 is a block diagram of an integrated circuit portion including a group of nine parallel circuit blocks that are selected by input and output multiplexers consistent with an embodiment of the present invention.

FIG. 3 is a block diagram of an integrated circuit portion including nine parallel circuit blocks that are selected by input and output multiplexers consistent with an embodiment of the present invention. Input and output multiplexers are used to select any eight of the nine parallel circuit blocks. Thus, even though one of the nine circuit blocks may have a defect rendering it nonfunctional, in this example P3 308, the remaining eight circuit blocks, P0 302 through P2 306 and P4 310 through P8 318, may be used. The desired functionality, that is eight circuits in parallel, is thus retained.

Figure 8:
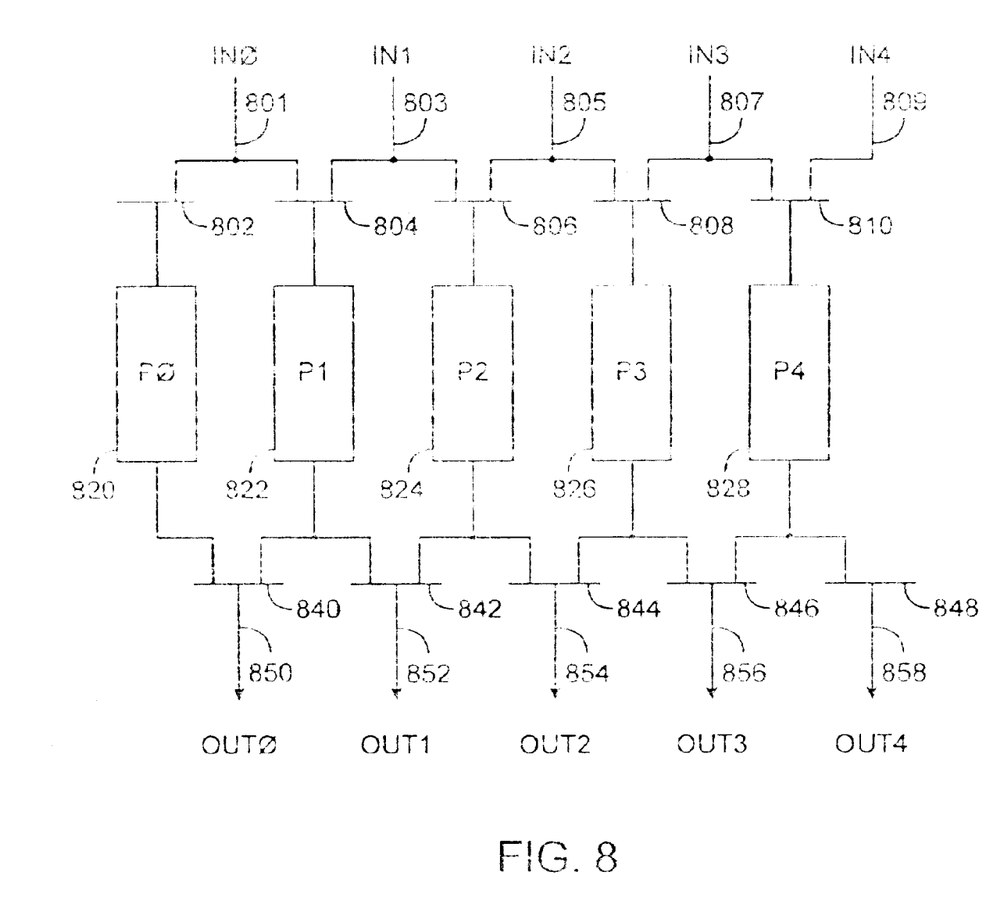
FIG. 8 is a block diagram illustrating an integrated circuit portion that may be sorted into various levels of functionality in a manner consistent with an embodiment of the present invention.

The overhead cost associated with this architecture is one redundant circuit block, the several input and output multiplexers, and wires from adjacent blocks. This may be a small price to pay in terms of die area, particularly if the likelihood of a defect occurring somewhere in eight circuit blocks is high. Further, the redundant circuit block can be made operational on integrated circuits with no defects, as illustrated in FIG. 8 below, thus providing extra performance.

Included in this integrated circuit portion are the nine input multiplexers 320, 322, 324, 326, 328, 330, 332, 334, and 336—one multiplexer for each circuit block, nine circuit blocks P0 302, P1 304, P2 306, P3 308, P4 310, P5 312, P6 314, P7 316, and P8 318, and eight output multiplexers 340, 342, 344, 346, 348, 350, 332, and 354—one multiplexer for each output signal. This and the other included figures show the inputs and outputs of these multiplexers but omit the select control signals for clarity. This figure, as with the other figures, is included for exemplary purposes only, and does not limit either the possible embodiments of the present invention or the claims.

This circuitry may be an integrated circuit, or it may be a portion of an integrated circuit. For example, a graphics processing unit 120 or 220, typically includes several stages of circuitry in succession or in a pipeline. This architecture is known as a graphics pipeline. Geometry processors, shader processors, texture filters, and raster operations circuits are some of the circuits that are included in a graphics pipeline. The circuitry shown in this and the other figures may be one or more of these or related circuits, for example, it may be a graphics pipeline stage. Alternately, the circuitry in these figures may be other types of circuitry.

In this particular example, P3 308 has been previously determined by testing to be nonfunctional. Accordingly, the remaining circuit blocks P0 302, P1 304, P2 306, P4 310, P5 312, P6 314, P7 316, and P8 318 are used. The input and output multiplexers steer the signals around P3 308 such that is not used. Specifically, input signal IN2 on line 362 is passed through multiplexer 324 to line 325 where it is received by circuit block P2 306. Similarly input signal IN3 on line 364 is routed through multiplexer 328 to line 329 where it is received by circuit block P4 310. In this case, multiplexer 326 is not active, that is, its output is not used.

The output of P2 306 is routed through mux 344 as output signal OUT2 on line 372. Similarly the output of P4 310 is routed through mux 346 as output signal OUT3 on line 374. Line 381 lists the circuit block proving the output signal for each output line. In the event that no circuit block is defective, a default circuit, such as P8 318, is not used, that is, the leftmost circuit or circuits are used, while the rightmost circuit or circuits are unused. In other embodiments, other default circuits may be unused, for example the rightmost circuits may be used, while the leftmost circuit or circuits are unused. In other embodiments, when no circuit block in the integrated circuit portion is defective, all circuit blocks are used to deliver additional performance, as shown in FIG. 8 below.

Each of these multiplexers may be a two-input multiplexer with one select control signal. Alternately, these multiplexers may be a specialized multiplexer such as a one hot multiplexer with an individual enable control for each input. The multiplexer control signals are omitted from the drawing for clarity. In other embodiments, each multiplexer may be a three-input or larger multiplexer. Alternatively, the multiplexers such as multiplexers 320–336 may be one combined circuit. There are several alternate multiplexer designs that may be implemented consistent with the present invention. However, it should be noted that these multiplexers typically do not change selection state during device operation. Therefore, the design may account for this. For example, they may be designed as simple switches having comparatively poor dynamic selection performance.

Input multiplexers 320 and 336 are optional, that is their respective inputs may be hardwired, since if they are nonfunctional, their outputs are ignored by the output multiplexers. However, depending on the exact circuit topology, the inclusion of multiplexers 320 and 336 is typically simple to implement, and may save power by reducing the capacitive load on signals IN0 on line 361 and IN7 on line 367. In other embodiments, such as the embodiment in FIG. 8, multiplexer 336 selects an additional input when no circuit block is defective.

When a circuit, such as P3 308, is determined to be nonfunctional, not only are input and output signals routed around that block, but its clock or clocks may be shut off or disabled as well. This provides a reduction in chip power dissipation and switching noise. Also, bias lines may be disabled. Moreover, since excess power supply current consumption may result from an integrated circuit defect such as a short circuit, the power supplies to nonfunctional circuit blocks may be disconnected. Care should be taken to avoid excessive drops in supply voltage caused by the inclusion of shut off mechanisms.

In these figures, each input and output and multiplexer line is shown as a single line for reasons of clarity. Typically however, each of these lines represent multiple wires, for example 100 to 2000 wires may be multiplexed into and out of each block, depending on the exact circuit blocks in question. Other embodiments of the present invention may multiplex fewer than 100 wires, while others may multiplex more than 2000 wires. Also, in this specific example, there are nine parallel circuit blocks, while in other examples there are different numbers of circuit blocks. In other embodiments of the present invention, there may be different numbers of circuit blocks, for example there may be 2, 20, 256, or more circuit blocks.

Again, many of the circuits in the graphics processing unit 220, or other GPUs, or high performance integrated circuits include circuit blocks that are pipelined, that is, a first circuit performs a first operation on an input and provides a first output to a second circuit which performs a second operation and provides a second output. If an integrated circuit includes such first and second circuits that are made up of more than one parallel circuit block, embodiments of the present invention may be used at each pipelined stage to improve circuit manufacturing yield.

Figure 4:
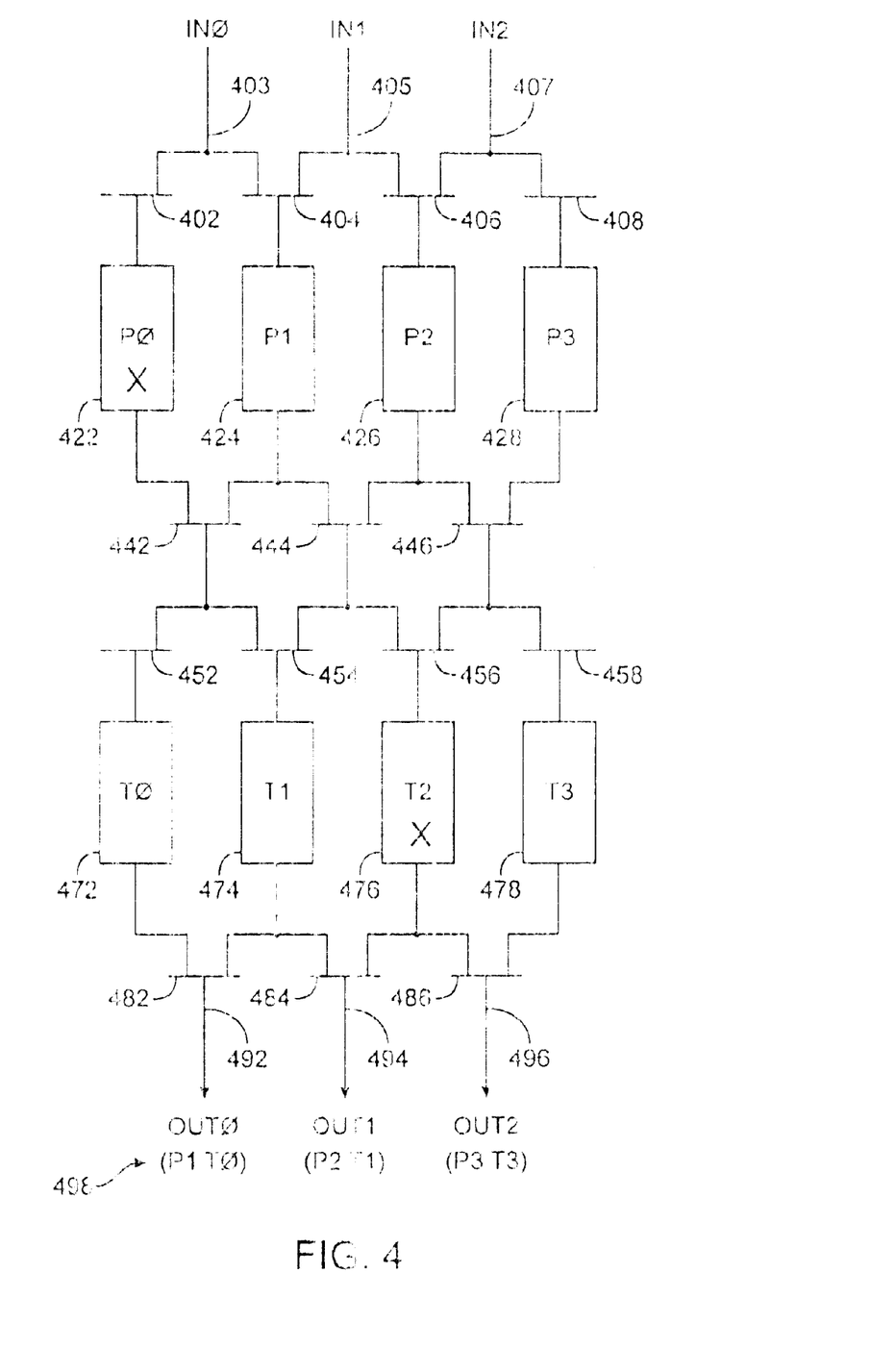
FIG. 4 is a block diagram illustrating a pipelined architecture incorporating an embodiment of the present invention.

FIG. 4 is a block diagram illustrating a pipelined architecture incorporating an embodiment of the present invention. In this figure, a first pipelined stage and a second pipelined stage each include input and output multiplexers such that functionality may be retained even though one of the individual circuit blocks in each of the first and the second pipelined stages are nonfunctional.

Included are a first pipelined stage made up of four parallel circuit blocks P0 422, P1 424, P2 426, and P3 428, and a second pipelined stage made up of four parallel circuit blocks T0 472, T1 474, T2 476, and T3 478. The first pipelined stage includes input multiplexers 402, 404, 406, and 408, and output multiplexers 442, 444, and 446. The second pipelined stage includes input multiplexers 452, 454, 456, and 458, and output multiplexers 482, 484, and 486.

In this particular example, circuit blocks P0 422 and T2 476 have previously been determined to be nonfunctional. Accordingly, the input and output multiplexers for these two pipelined stages steer signals around those blocks and utilize the remaining circuit blocks. Specifically, input signal IN0 on line 403 is routed through mux 404 to circuit block P1 424. The input signal IN1 on line 405 is routed through mux 406 to circuit block P2 426, while input signal 1N2 on line 407 is routed through mux 408 to circuit block P3 428.

The output of P1 424 is routed through multiplexer 442 and multiplexer 452 to circuit block T0 472. The output of circuit block P2 426 is routed through multiplexer 444 and multiplexer 454 to circuit block T1 474, while the output of circuit block P3 428 is routed through multiplexer 446 and multiplexer 458 to circuit block T3 478. The output of circuit block T0 472 is routed through multiplexer 482 and provided as OUT0 on line 492. The output of circuit block T1 474 is routed through multiplexer 484 and provided as OUT1 on line 494, while the output of circuit block T3 478 is routed through multiplexer 486 and provided as OUT2 on line 496.

Line 498 indicates the paths taken from the inputs to the outputs. Specifically, data IN0 on line 403 is operated on by circuit blocks P1 424 and T0 472 and provided as OUT0 on line 492. Similarly, data IN1 on line 405 is operated on by circuit blocks P2 426 and T1 474 and provided as OUT1 on line 494, while data IN2 on line 407 is operated on by circuit blocks P3 428 and T3 478 and provided as OUT2 on line 496. In this way, the defective circuit blocks P0 422 and T2 476 are effectively excised or circumscribed from the pipelined stages, and the remaining circuit blocks are used. This enhances the yield since these two pipelined stages are fully functional, even though two of their circuit blocks are nonfunctional.

In this particular example, there are four circuit blocks in each pipelined stage. In other embodiments, there may be a different number of circuit blocks in each pipelined stage, and each pipelined stage may include a different number of blocks. Further, two pipelined stages are shown, though other embodiments may include three or more such pipelined stages. In some embodiments of the present invention, some pipelined stages may include a number of parallel circuit blocks, while others stages may not. Also, not all stages may need to include embodiments of the present invention, that is, one pipelined stage may include embodiments, while the next does not.

Figure 5:
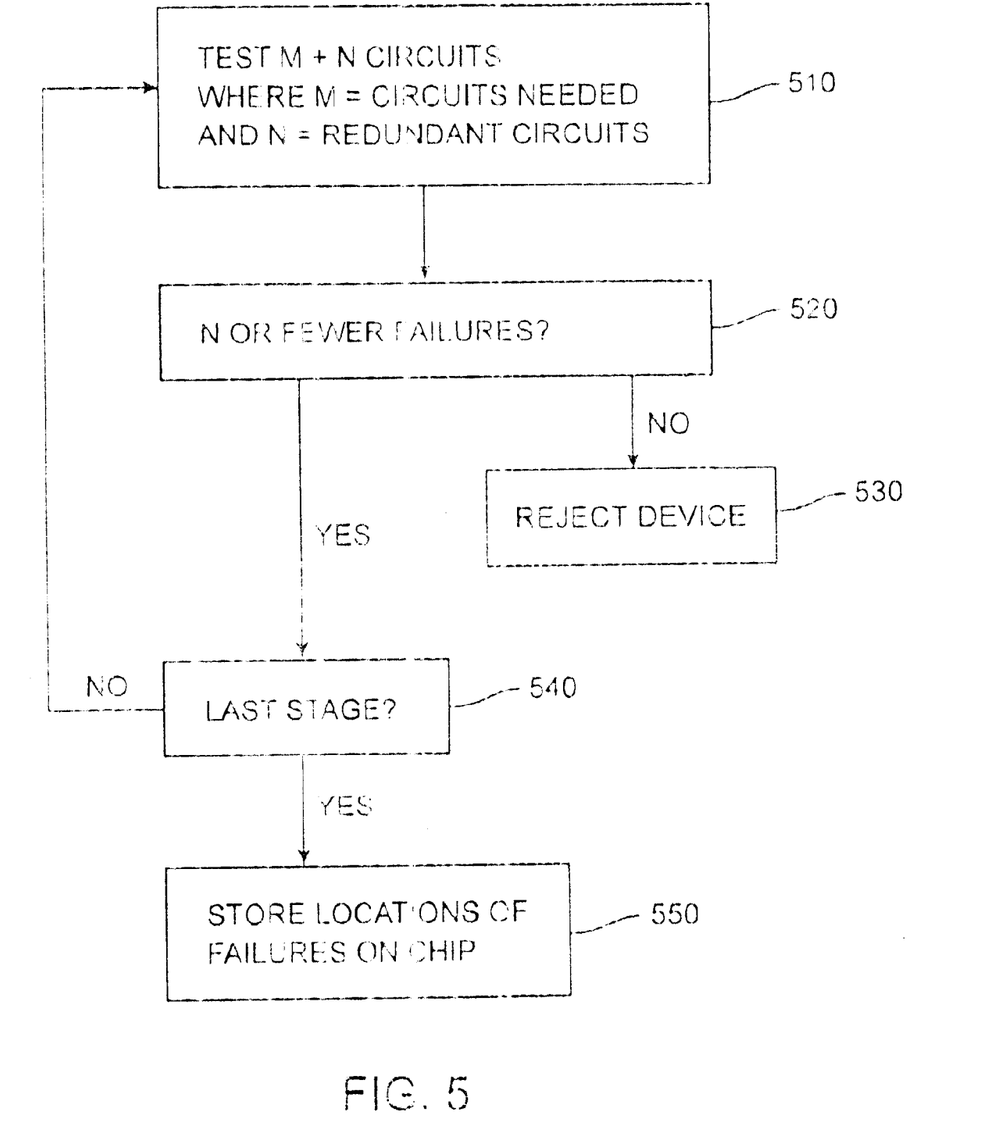
FIG. 5 is a flowchart illustrating a method of testing an integrated circuit consistent with an embodiment of the present invention.

FIG. 5 is a flowchart illustrating a method of testing an integrated circuit consistent with an embodiment of the present invention. In act 510, M plus N circuits are tested, for example, in a portion of the integrated circuit. In this example, M is the number of circuit blocks that are needed for a functional circuit, and N is the number of redundant circuits that are included in the portion of the integrated circuit. It is also the number of circuits that may fail while still providing a fully functional integrated circuit portion. In act 520, it is determined whether there are N, or fewer, failures. If there are more than N failures, the device is rejected in act 530, since there are not enough redundant circuits to compensate for the number of failures. For example, the failed die may be marked with ink or other indicator, such that they may be removed after the die on the wafer are separated.

If there are N or fewer failures, it is determined in act 541 whether the last integrated circuit portion to be tested has been tested. If not, the next integrated circuit portion is tested in act 510. If all integrated circuit portions have been tested, the locations of the failures are stored on the integrated circuit (or other storage location that may be accessed by the integrated circuit) in act 550. These failure locations may be stored as blown fuses, bits in memory or registers, or they may be stored in another type of storage. The stored failure locations are then used to select paths through multiplexers or other selection circuitry at the input and output of the appropriate integrated circuit portions.

It will be appreciated by one skilled in the art that variations of this method may be made consistent with embodiments of the present invention. For example, in act 510, M circuit blocks may be tested, and if all M circuit blocks are functional, those circuits may be used, thus saving the time that would be needed to test the other N circuits. If there are failures, circuit blocks may continue to be tested until M good circuit blocks have been found. Also, deductive reasoning or test experience may indicate which integrated circuit portions are likely to yield poorly, and those portions may be tested before others are tested. Also, the locations of the failures (in act 550) may be stored after each integrated circuit portion is tested.

In the specific examples shown in FIGS. 3 and 4, input and output multiplexers provide paths around one defective circuit block in each integrated circuit portion. Embodiments of the present invention can be extended to configurations that allow more than one defective or nonfunctional circuit block in an integrated circuit portion.

Figure 6:
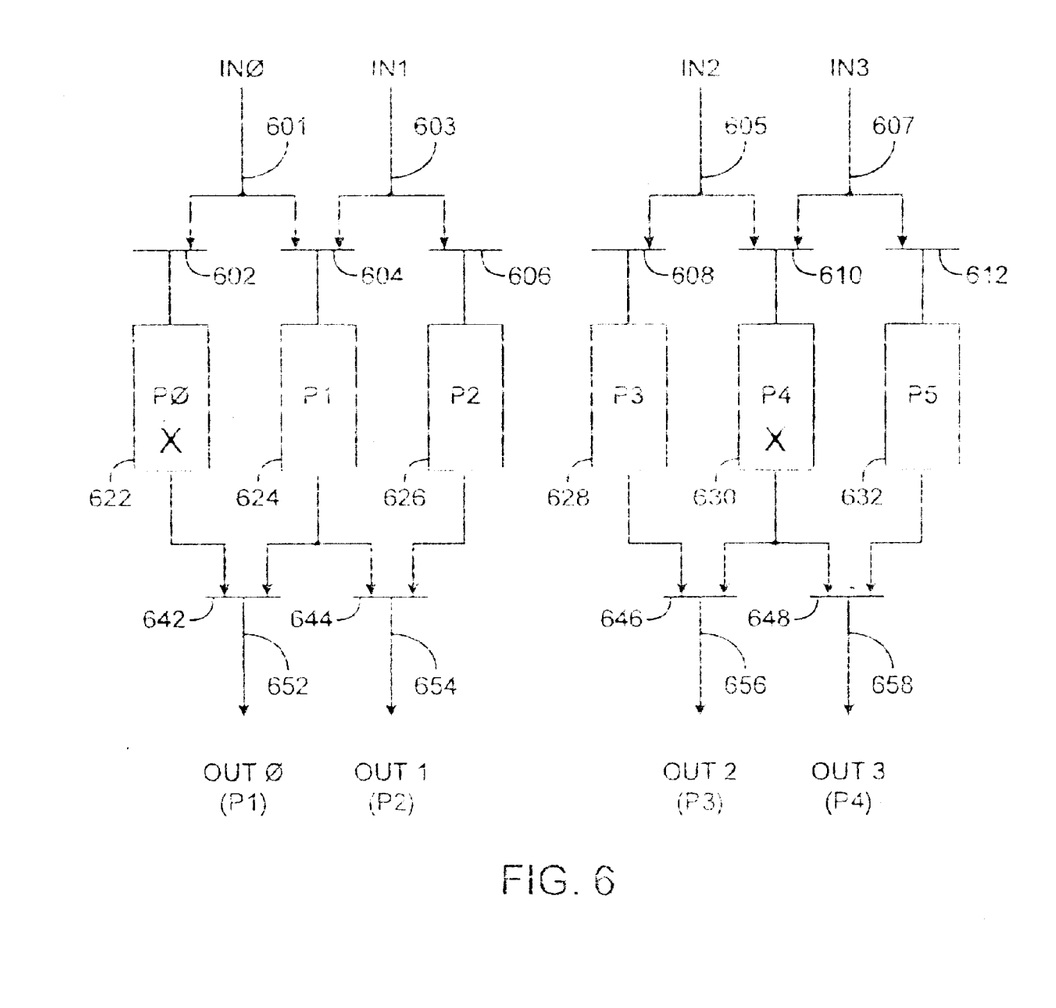
FIG. 6 is a block diagram of an integrated circuit portion including two groups of circuit blocks consistent with an embodiment of the present invention.

FIG. 6 is a block diagram of an integrated circuit portion including two groups of circuit blocks consistent with an embodiment of the present invention. Each group of circuit blocks includes three separate circuit blocks, and input and output multiplexers route signals around one defective or nonfunctional circuit block in each group.

Included are a first circuit group made up of circuit blocks P0 622, P1 624, and P2 626, input multiplexers 602, 604, and 606, and output multiplexers 642 and 644, and a second circuit group made up of circuit blocks P3 628, P4 630, and P5 632, input multiplexers 608, 610, and 612, and output multiplexers 646 and 648.

In this configuration, one of the circuit blocks in each of the groups of three circuit blocks may be nonfunctional, while still allowing for a fully functional integrated circuit portion. For example, circuit blocks P0 622 and P4 630 may be nonfunctional, but since the remaining circuit blocks may be used, this integrated circuit portion is functional, and yield is thus improved. If circuit blocks P0 622 and P4 630 are nonfunctional, signals are routed around those circuits, and circuit blocks P1 624, P2 626 are used in the first group, while circuit blocks P3 628 and P5 632 are used in the second.

Specifically, input signal IN0 on line 601 is routed through multiplexer 604 to circuit block P1 624, while input signal IN1 on line 603 is routed through multiplexer 606 to circuit block P2 626. Similarly, input signal IN2 on line 605 is routed through multiplexer 608 to circuit blocks P3 628, while input signal IN3 on line 607 is routed through multiplexer 612 to circuit block P5 632.

The output signals are similarly routed from functional blocks to the output lines, thus avoiding nonfunctional circuit blocks. Specifically, the output of circuit block P1 624 is routed through multiplexer 642 and provided as OUT0 on line 652. The output of circuit block P2 626 is routed through multiplexer 644 and provided as OUT1 on line 654. Similarly, the output of circuit block P3 628 is routed through multiplexer 646 and provided as OUT2 on line 656, while the output of circuit block P5 632 is routed through multiplexer 648 and provided as OUT3 on line 658.

In this specific example, two circuit groups of three circuit blocks are shown. In other embodiments of the present invention, there may be different numbers of circuit blocks divided into different numbers of groups. For example, if 256 functional circuit blocks are needed, 264 parallel circuit blocks may be divided into eight groups of 33 circuit blocks each, where 32 of each group are used, and there is one redundant circuit block in each group.

The configuration shown in FIG. 6 works well when compensating for one defect in each group of circuit blocks. Unfortunately, there may be more than one defective circuit block in a group of circuit blocks. In that case, it is advantageous to provide circuits, methods, and apparatus to compensate for two or more defective or nonfunctional circuit blocks in a group.

Figure 7:
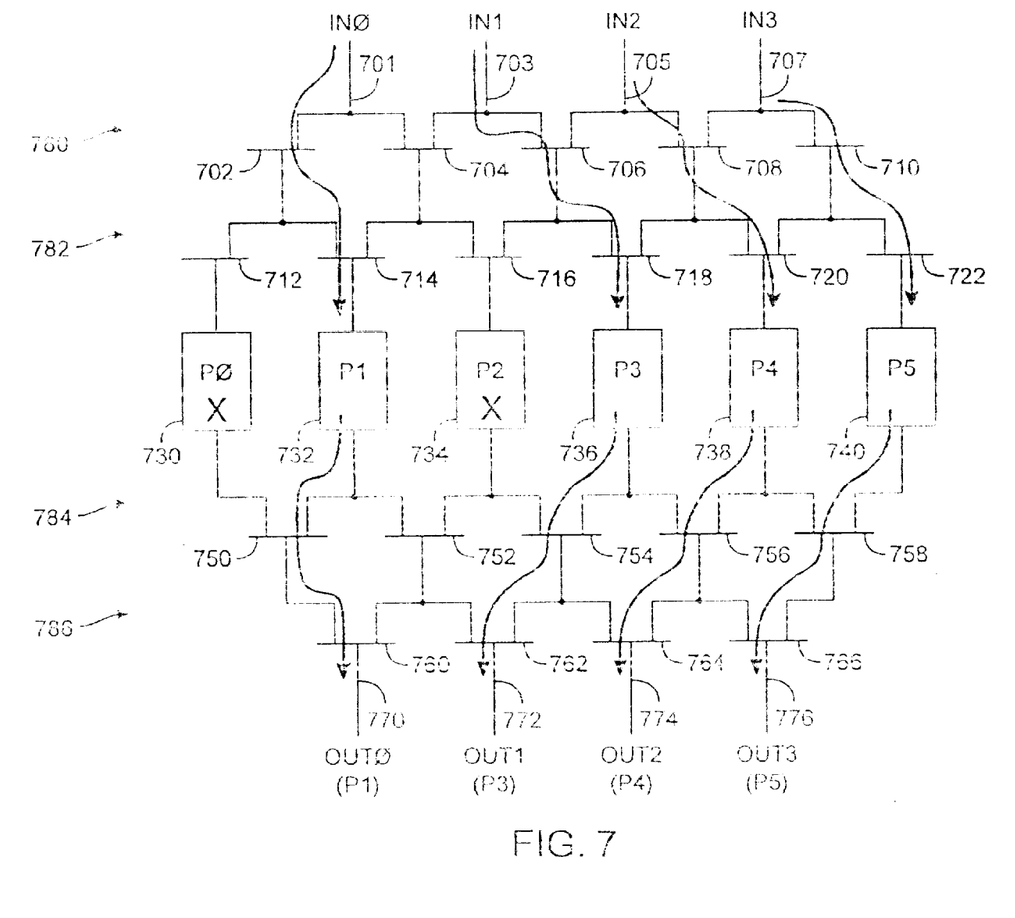
FIG. 7 is a block diagram of an integrated circuit portion that includes two redundant circuit blocks consistent with an embodiment of the present invention.

FIG. 7 is a block diagram of an integrated circuit portion that includes two redundant circuit blocks in a group consistent with an embodiment of the present invention. One skilled in the art will appreciate that this may be extended to include three or more redundant circuit blocks.

Included are a group of circuit blocks connected to two layers of multiplexers (or two multiplexers, depending on the exact implementation of the input selection circuitry) at the inputs and outputs. Specifically, circuit blocks P0 730, P1 732, P2 734, P3 736, P4 738, and P5 740 are coupled to two tiers or layers of input multiplexers at their input, the first layer 788 including multiplexers 702, 704, 706, 708, and 710, and the second layer 782 including multiplexers 712, 714, 716, 718, 720, and 722, and two layers of output multiplexers, the first layer 784 including multiplexers 750, 752, 754, 756, and 758, and a second layer 786 including multiplexers 760, 762, 764, and 766.

In other embodiments of present invention, this circuitry may be implemented using only one tier of multiplexers, for example where each multiplexer is a three input multiplexer. However, when deciding which type of architecture to use, consideration of the number of routing wires should be taken into account. The specific implementation shown may reduce the number of wires needed in the horizontal direction, if the circuit is layed out in an arrangement with the same orientation as the figure. This in turn may reduce the length of the layout of this circuitry in the vertical direction depending on the number of wires multiplexed and the implementation chosen.

In this example, there are four input and four output lines. Thus, so long as four of the six included circuit blocks are functional, the input and output multiplexers can steer input and output signals around a total of two nonfunctional circuit blocks, while retaining full functionality for this integrated circuit portion.

Also in this example, the circuit blocks P0 730 and P2 734 have been determined by testing to be nonfunctional. Accordingly, circuit blocks P1 732, P3 736, P4 738, and P5 740 are used. Specifically, input signal IN0 on line 701 is routed through multiplexers 702 and 714 to circuit block P1 732. Similarly, input signal IN1 on line 703 is routed through multiplexers 706 and 718 to circuit block P3 736, input signal IN2 on line 705 is routed through multiplexers 708 and 720 to circuit block P4 738, while input signal IN3 on line 707 is routed through multiplexers 710 and 722 to circuit block P5 740.

Also, the output of P1 732 is routed through multiplexers 750 and 760 and provided as OUT0 on line 770. Similarly, the output of P3 736 is routed through multiplexers 754 and 762 and provided as OUT1 on line 772, the output of P4 738 is routed through multiplexers 756 and 764 and provided as OUT2 on line 774, while the output of P5 740 is routed through multiplexers 758 and 766 and provided as OUT3 on line 776.

In this way, two tiers or layers of multiplexers are provided at the input and output of this group of circuit blocks, thus providing two redundant circuit blocks. It will be appreciated by one skilled in the art that further layers of multiplexers, or other multiplexer schemes using multiplexers having more than two inputs, may be used to provide larger numbers of redundant circuit blocks. It will also be appreciated that this architecture may be combined with the other embodiments shown in the figures herein.

On a particular integrated circuit, all the circuit blocks in an integrated circuit portion may be functional, and no redundant circuits are needed. In that case, it may be desirable to include the functionality or performance of what would otherwise be a redundant, unused circuit. This may be done if integrated circuits having a reduced level of functioning or performance can also be sold or otherwise used. For example, if four parallel circuit blocks are included in an integrated circuit portion and all four circuits are functional, that device may be sold as a premium performance or highly functioning device. If three of the circuit blocks are functioning, the device may be sold as a device having a lower functionality or performance, perhaps at a lower price. Similarly, circuits having two or one functioning circuit blocks may be sold as even lower-level functioning devices, depending on the circuit in question.

FIG. 8 is a block diagram illustrating an integrated circuit portion that may be sorted into various levels of functionality or performance in a manner consistent with an embodiment of the present invention.

Included are a group of circuit blocks P0 820, P1 822, P2 824, P3 826, and P4 828, input multiplexers 802, 804, 806, 808, and 810, and output multiplexers 840, 842, 844, 846, and 848. In this architecture, there are five input lines, five output lines, and five circuit blocks. If each circuit block is functional, the five inputs and outputs are functional and this integrated circuit portion is at its highest level of functionality or performance. If one circuit block is nonfunctional, four inputs and outputs may be steered towards and from the remaining four functional circuit blocks. For example, input signals IN0 on line 801, In1 on line 803, IN2 on line 805, and IN3 on line 807 may be used, while input signal IN4 on line 809 is ignored. Similarly, output signals OUT0 on line 850, OUT1 on line 852, OUT2 on line 854, and OUT3 on line 856 may be used, while input signal OUT4 on line 858 is ignored.

In this case, this integrated circuit portion includes four functional inputs and outputs, and thus is only capable of operating at lower functionality or performance. These lower functioning devices may be provided as products, perhaps at lower prices, as mentioned above. Also, still lower functionality devices, for example where three, two, or one circuit block is functional, may be provided as products. Thus, each wafer yields more usable integrated circuits, effectively increasing manufacturing yield and reducing the average cost per product chip.

Figure 9:
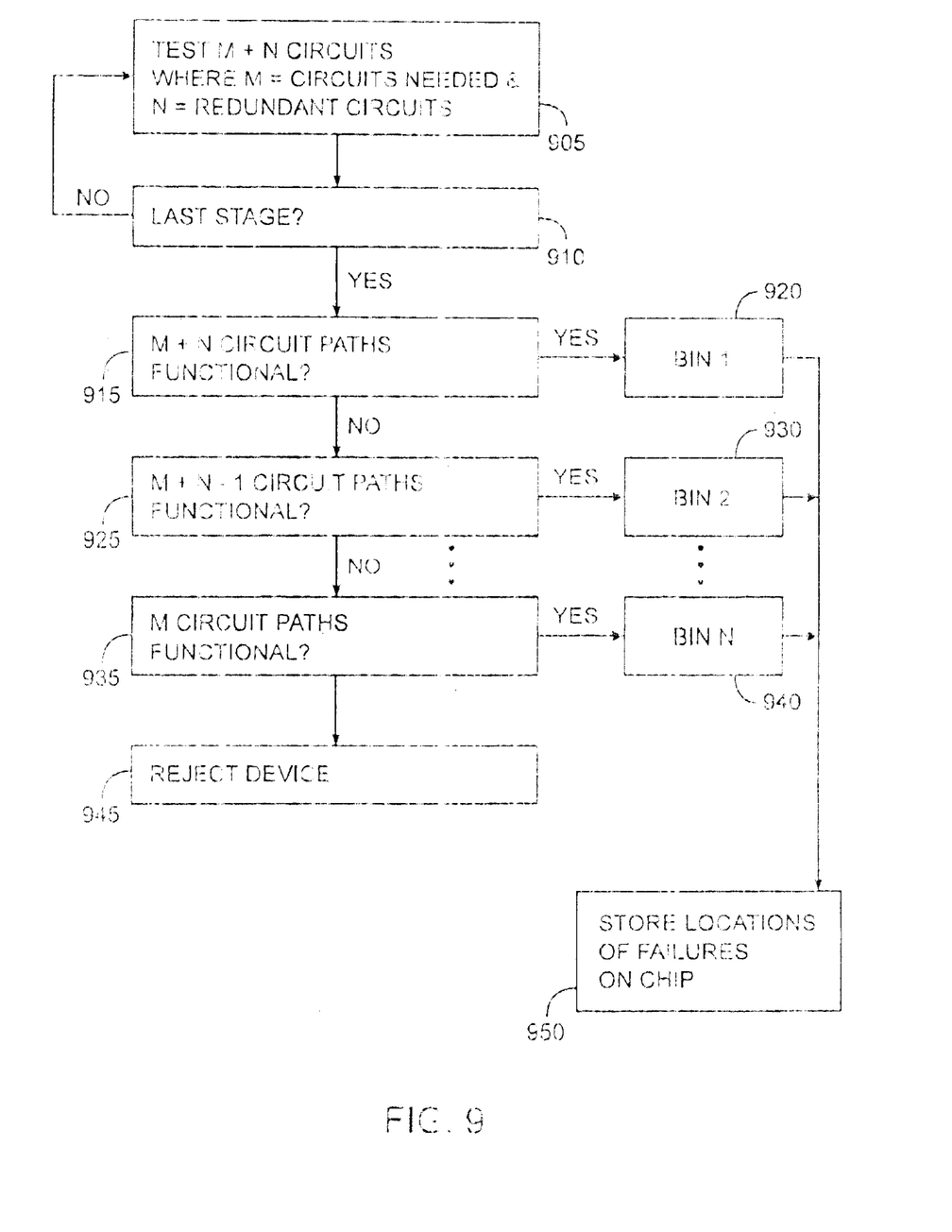
FIG. 9 is a flowchart of a method of sorting devices based on their level of functionality in a manner consistent with an embodiment of the present invention.

FIG. 9 is a flowchart of a method of testing and binning integrated circuits based on their level of functionality or performance in a manner consistent with an embodiment of the present invention. This testing may be done at various points in the manufacturing process, for example at wafer sort or final test, where wafer-sort testing is done at the wafer level, and final test is typically done after the wafer has been scribed and packaged, though it may occur after individual devices have been placed on a substrate, for example as part of a hybrid package.

In act 905, M plus N circuit blocks are tested in a particular pipelined stage, integrated circuit portion, or in a group of circuit blocks in such a pipelined stage or integrated circuit portion, where M is the number of circuits that are needed for a minimum level of functionality or performance, N is the number of potentially redundant circuits, and M plus N is the number of circuit blocks being tested. In act 910, it is determined whether the last pipelined stage or integrated circuit portion has been tested. If it hasn't, the next pipelined stage or integrated circuit portion is tested. Alternately, stages may be tested in parallel. For each pipelined stage or integrated circuit portion, there may be a different value for M and N.

If the integrated circuit testing is completed, it is determined whether M plus N circuit paths are functional through all stages in act 915. If they are, the device may be binned as a highest functioning or performing device, commonly referred to as a Bin 1 device, in act 920. If M plus N less one circuit paths are functional, the device may be binned as a lower grade, or Bin 2 device in act 930. Similarly, as fewer circuit blocks are functional as determined in act 935, the device may be binned as a lower bin device in act 940. If fewer than the minimum number of circuit paths M are functional, the device is rejected in act 945. Without the defect-tolerant circuits described above, only Bin 1 devices, those having zero defects, would be classified as functional. This method enables devices with defects to yield usable products with reduced functionality or performance.

If the device is placed in one of the bins in acts 920, 930, or 940, then in act 950 the location of any failures are stored on the device, or in a location accessible by the device being tested. Again, these locations may be stored as fuses, in memories, registers, or other memory storage devices. The stored locations are then used to control the selection of the input and output multiplexers or other selection circuitry.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit comprising:
   a first circuit block;
   a second circuit block;
   a first selection circuit coupled to receive an input signal and provide an output to the first circuit block;
   a second selection circuit coupled to receive the input signal and provide an output to the second circuit block; and
   a third selection circuit coupled to receive an output from the first circuit block and an output from the second circuit block and further configured to provide a first output signal,
   wherein if the first circuit block is defective, the first selection circuit does not couple the input signal to the first circuit block and the second selection circuit couples the input signal to the second circuit block, otherwise the first selection circuit couples the input signal to the first circuit block and the second selection circuit does not couple the input signal to the second circuit block.

2. The integrated circuit of claim 1 wherein if the first circuit block is defective, the third selection circuit provides the output of the second circuit block as the first output signal, otherwise the third selection circuit provides the output of the first circuit block as the first output signal.

3. The integrated circuit of claim 1 wherein the first selection circuit comprises a multiplexer.

4. The integrated circuit of claim 1 wherein the first circuit block is found to be either defective or functional during a wafer-sort test.

5. The integrated circuit of claim 1 further comprising:
   a storage element configured to store at least one bit indicating whether the first circuit block is defective.

6. The integrated circuit of claim 5 wherein the storage element comprises a fuse.

7. The integrated circuit of claim 5 wherein the storage element comprises a memory cell.

8. The integrated circuit of claim 1 further comprising:
   a third circuit block;
   a fourth circuit block;
   a fourth selection circuit coupled to receive the first output signal and provide an output to the third circuit block;
   a fifth selection circuit coupled to receive the first output signal and provide an output to the fourth circuit block; and
   a sixth selection circuit coupled to receive an output from the third circuit block and an output from the fourth circuit block and further configured to provide a second output signal,
   wherein if the third circuit block is defective, the fourth selection circuit does not couple the first output signal to the third circuit block and the fourth selection circuit couples the first output signal to the fourth circuit block, otherwise the fourth selection circuit couples the first output signal to the third circuit block and the fifth selection circuit does not couple the input signal to the second circuit block.

9. The integrated circuit of claim 8 wherein if the third circuit block is defective, the sixth selection circuit provides the output of the fourth circuit block as the second output signal, otherwise the sixth selection circuit provides the output of the third circuit block as the second output signal.

10. An integrated circuit comprising:
   a first circuit block;
   a second circuit block;
   a first selection circuit coupled to receive a first input signal and provide an output to the first circuit block;
   a second selection circuit coupled to receive the first input signal and a second input signal and provide an output to the second circuit block;
   a third selection circuit coupled to receive an output from the first circuit block and an output from the second circuit block and further coupled to provide a first output signal; and
   a fourth selection circuit coupled to receive the output from the second circuit block and further coupled to provide a second output signal,
   wherein if the first circuit block is defective, the first selection circuit does not couple the first input signal to the first circuit block and the second selection circuit couples the first input signal to the second circuit block, otherwise the first selection circuit couples the first input signal to the first circuit block and the second selection circuit couples the second input signal to the second circuit block.

11. The integrated circuit of claim 10 wherein if the first circuit block is defective, the third selection circuit provides the output of the second circuit block as the first output signal, otherwise the third selection circuit provides the output of the first circuit block as the first output signal and the fourth selection circuit provides the output of the second circuit block as the second output signal.

12. The integrated circuit of claim 10 wherein the first selection circuit comprises a multiplexer.

13. The integrated circuit of claim 10 further comprising:
   a storage element configured to store at least one bit indicating whether the first circuit block is defective.

14. The integrated circuit of claim 13 wherein the storage element is a fuse.

15. A method of testing an integrated circuit comprising:
   testing a plurality of circuit blocks in a portion of the integrated circuit;
   determining a number of defective circuit blocks in the plurality of circuit blocks;
   if the number of defective circuit blocks is equal to or less than a number of redundant blocks in the plurality of circuit blocks, then programming the integrated circuit with a number of programmable bits,
   wherein the programmable bits determine a selection made by a first selection circuit coupled to the input of one of the plurality of circuit blocks, and a selection made by a second selection circuit coupled to the output of the one of the plurality of circuit blocks.

16. The method of claim 15 wherein the programmable bits are stored by blowing a fuse.

17. The method of claim 15 wherein the programmable bits are stored in a memory.

18. The method of claim 15 wherein if the number of defective circuit blocks in the plurality of circuit blocks is zero, the device is sorted in a first bin.

19. The method of claim 18 wherein if the number of defective circuit blocks in the plurality of circuit blocks is one, the device is sorted in a second bin.

20. The method of claim 19 wherein the sorting in a first bin and sorting in a second bin is done at a wafer-sort test.

21. The method of claim 19 wherein the sorting in a first bin and sorting in a second bin is done at a final test.

* * * * *